United States Patent
Inoue et al.

(10) Patent No.: US 8,371,027 B2
(45) Date of Patent: Feb. 12, 2013

(54) ELECTRONIC COMPONENTS MOUNTING METHOD

(75) Inventors: Masafumi Inoue, Saga (JP); Mitsuhaya Tsukamoto, Fukuoka (JP); Masahiro Kihara, Fukuoka (JP); Syoichi Nishi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 739 days.

(21) Appl. No.: 12/279,024

(22) PCT Filed: Apr. 12, 2007

(86) PCT No.: PCT/JP2007/058475
§ 371 (c)(1),
(2), (4) Date: Aug. 11, 2008

(87) PCT Pub. No.: WO2007/119869
PCT Pub. Date: Oct. 25, 2007

(65) Prior Publication Data
US 2009/0064489 A1    Mar. 12, 2009

(30) Foreign Application Priority Data
Apr. 13, 2006   (JP) ................... 2006-110675

(51) Int. Cl.
*H05K 3/36*    (2006.01)

(52) U.S. Cl. ............... 29/832; 29/840; 29/833; 29/721; 228/105

(58) Field of Classification Search .......... 29/832–834, 29/840–842, 712–721; 228/9, 105; 700/9, 700/19, 28
See application file for complete search history.

(56) References Cited

U.S. PATENT DOCUMENTS

| | | | |
|---|---|---|---|
| 5,564,183 A * | 10/1996 | Satou et al. | 29/840 |
| 5,607,097 A | 3/1997 | Sato | |
| 6,729,532 B2 * | 5/2004 | Inoue et al. | 228/254 |
| 6,757,966 B2 * | 7/2004 | Inoue et al. | 29/840 |
| 7,213,332 B2 * | 5/2007 | Inoue et al. | 29/840 |
| 8,020,286 B2 * | 9/2011 | Inoue et al. | 29/832 |
| 2002/0083570 A1 | 7/2002 | Inoue | |
| 2004/0085701 A1 | 5/2004 | Inoue | |
| 2005/0209822 A1 | 9/2005 | Ishiba et al. | |
| 2006/0018531 A1 | 1/2006 | Murakami et al. | |

FOREIGN PATENT DOCUMENTS

| | | |
|---|---|---|
| JP | 08-035826 | 2/1996 |
| JP | 2002-134899 | 5/2002 |
| JP | 2004-031868 A | 1/2004 |
| JP | 2005-286309 A | 10/2005 |
| JP | 2006-58284 A | 3/2006 |

OTHER PUBLICATIONS

International Search Report for PCT/JP2007/058475; Jul. 6, 2007.

* cited by examiner

*Primary Examiner* — Minh Trinh
(74) *Attorney, Agent, or Firm* — Pearne & Gordon LLP

(57) ABSTRACT

In an electronic components mounting process fabricating a mount circuit board due to an electronic components mounting system formed of a plurality of electronic components mounting apparatuses by connecting them to each other, data of solder paste position which is printed on the circuit board is transmitted as feedforward data to an electronic components placement apparatus and a placement state inspecting apparatus. A control parameter which controls a placing position in a components placement operation due to the electronic components placement apparatus and an inspection parameter which indicates a standard position of the components in a placement state inspection are updated on the basis of the soldering position data. Therefore, it is possible to achieve a precise mounting by effectively and properly using inspection information obtained from each process.

2 Claims, 10 Drawing Sheets

ELECTRONIC COMPONENTS MOUNTING METHOD

TECHNICAL FIELD

The present invention relates to an electronic components mounting system which mounts electronic components on a circuit board, a placement state inspecting apparatus which inspects a placement state of the electronic components in the system, and an electronic component mounting method.

BACKGROUND ART

An electronic components mounting system fabricating the circuit board on which electronic components are mounted by soldering is formed of a plurality of apparatuses for mounting electronic components such as a solder printing apparatus, an electronic components placement apparatus, and a reflow apparatus by connecting them to each other. In such an electronic components mounting system, an inspection apparatus is disposed between the apparatuses on purpose to perform a quality control in high reliability. Therefore, it has been performed to grant a function automatically judging whether it is suitable or not (For example, refer to patent documents 1 and 2).

In an example described in patent document 1, based on the result that an electrode position where components are conjugated is practically measured by a recognition process, it is judged whether a mount quality of the components is good. In an example described in patent document 2, the print inspection apparatus is disposed between the printing apparatus and the electronic components placement apparatus, and a placement state inspecting apparatus is disposed between the electronic components placement apparatus and a reflow apparatus. The print inspection apparatus also performs a precise quality control by detecting a print position error or a placement position error through every process. If the print inspection apparatus detects an abnormal state in operation states of the apparatuses, feedback information for correcting that is transmitted to entire processes, and feedforward information for minimizing these affections are transmitted to following processes. Due to this, the precise quality control is achieved in the fabricating process of the mount circuit board.

[Patent Document 1] JP-A-8-35826
[Patent Document 2] JP-A-2002-134899

DISCLOSURE OF THE INVENTION

However, in a preceding technology example described above, it is difficult to mention that overall quality control effectively utilizes an inspection data which is obtained by an inspection arranged between each process of a components mounting line. For example, in a solder print process before placing components, a components placement position is corrected in accordance with the state of a position error in a components placement of a following process when a solder is printed in a state shifted from the electrode position. Therefore, it is possible to minimize an affection of the print position error. However, the electronic components which are placed in such a way shifted from the electrode itself, and thus "position error" judgment occurs in the following inspection for a placement state.

As mentioned above, in the known electronic components mounting system, the inspection information obtained by the inspection between each process is appropriately used, whereupon there is a problem that an accuracy management of the precise mounting is not achieved.

Accordingly, it is an object of the invention to provide electronic components mounting system, a placement state inspecting apparatus, and an electrode mounting method which are possible to precisely manage a mounting accuracy by properly using inspection information obtained from each process.

An electronic components mounting system has a plurality of electronic components mounting apparatuses connected to each other and fabricates a mount circuit board by soldering electronic components on a circuit board. The system includes a printing apparatus printing solder paste on electrodes which are formed on the circuit board and to which the electronic components are bonded, and a first inspection apparatus having a soldering position detecting function of detecting a position of the printed solder paste and outputting the detection result as soldering position data. Also included is a electronic components placement apparatus picking up the electronic components from a components supply unit by the use of a mounting head and placing the electronic components on the circuit board on which the solder paste is printed, a second inspection apparatus having a component placement position detecting function of detecting positions of the electronic components placed on the circuit board on which the solder paste is printed and outputting the detection result as the component placement position data, and soldering means for soldering the placed electronic components on the circuit board by heating and melting the solder paste. In the system, a control parameter indicating the placing position at the time of placing the electronic components by the use of the electronic components placement apparatus and an inspection parameter indicating a standard position at the time of making an inspection by the use of the second inspection apparatus are updated on the basis of the soldering position data.

A placement state inspecting apparatus is disposed in an electronic components mounting system having a plurality of electronic components mounting apparatuses connected to each other and fabricating a mount circuit board by soldering electronic components on a circuit board. In the placement state inspecting apparatus, the placement state inspecting apparatus is located on a downstream side of a printing apparatus printing solder paste on electrodes which are formed on the circuit board and to which the electronic components are bonded, a first inspection apparatus having a soldering position detecting function of detecting a position of the printed solder paste and outputting the detection result as soldering position data, and an electronic components placement apparatus picking up the electronic components from a components supply unit by the use of a mounting head and placing the electronic components on the circuit board on which the solder paste is printed. The placement state inspecting apparatus has a components placement position detecting function of detecting positions of the electronic components placed on the circuit board on which the solder paste is printed and outputting the detection result as the component placement position data, and the components placement position detecting function is to detect a position of the electronic components by the use of an inspection parameter which is updated on the basis on the soldering position data transmitted from the printing apparatus.

An electronic components mounting method of fabricating a mount circuit board by soldering electronic components on a circuit board due to an electronic components mounting system formed of a plurality of electronic components mounting apparatus connected to each other. The method includes a printing process of printing solder paste on electrodes which are formed on the circuit board and to which the electronic components are bonded, by the use of a printing apparatus, and a detection process of detecting a position of the printed solder paste and outputting the detection result as soldering position data, by the use of a first inspection apparatus. Also included is a placing process of picking up the electronic components from components supply unit by the use of a mounting head and placing the electronic components on the circuit board on which the solder paste is printed, a components placement position detection process of detecting positions of the electronic components placed on the circuit board on which the solder paste is printed and outputting the detection result as the components placement position data, by the use of a second inspection apparatus, and a soldering process of soldering the placed electronic components on the circuit board by heating and melting the solder paste, by using soldering means. In the system, a control parameter indicating the placing position at the time of placing the electronic components by the use of the electronic components placement apparatus and an inspection parameter indicating a standard position at the time of making an inspection by the use of the second inspection apparatus are updated on the basis of the soldering position data.

According to the invention, a control parameter indicating the placing position at the time of placing the electronic components by the use of the electronic components placement apparatus and an inspection parameter indicating a standard position at the time of making an inspection by the use of the second inspection apparatus are updated on the basis of the soldering position data which is detected by a first inspection apparatus. Therefore, it is possible to precisely manage a mounting accuracy by properly using inspection information obtained from each process.

BEST MODE FOR CARRYING OUT THE INVENTION

Figure 1:
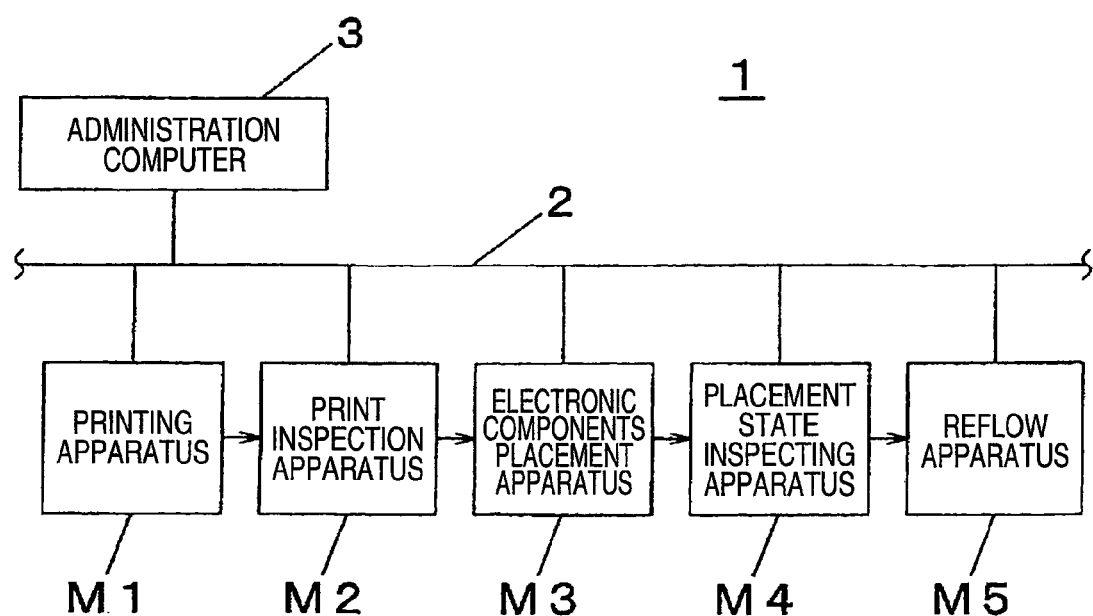
FIG. 1 is a block diagram illustrating a configuration of an electronic components mounting system according to an embodiment of the invention.

Next, it will be described about an embodiment of the invention by referring to the drawings.

First, referring to FIG. 1, the electronic components mounting system will be described. In FIG. 1, the electronic components mounting line 1 is formed of a printing apparatus M1, a print inspection apparatus M2, a electronic components placement apparatus M3, a placement state inspecting apparatus M4, and a reflow apparatus M5 by connecting them to each other. The electronic components mounting line 1 is connected by a communication network 2, and it is configured to control whole apparatuses by an administration computer 3. The printing apparatus M1 prints solder paste for soldering the electronic components on an electrode of a circuit board by the use of a screen printing. The print inspection apparatus M2 (a first inspection apparatus) inspects a printing state in the printed circuit board. The electronic components placement apparatus M3 place the electronic components on the circuit board on which the solder paste is printed. The placement state inspecting apparatus M4 (a second inspection apparatus) inspects an existence of the electronic components on the circuit board where the electronic components are placed or a position error. The reflow apparatus M5 (soldering means) solders the electronic components on the circuit board by heating and melting the solder, since the circuit board where the electronic components are placed is heated.

Figure 2:
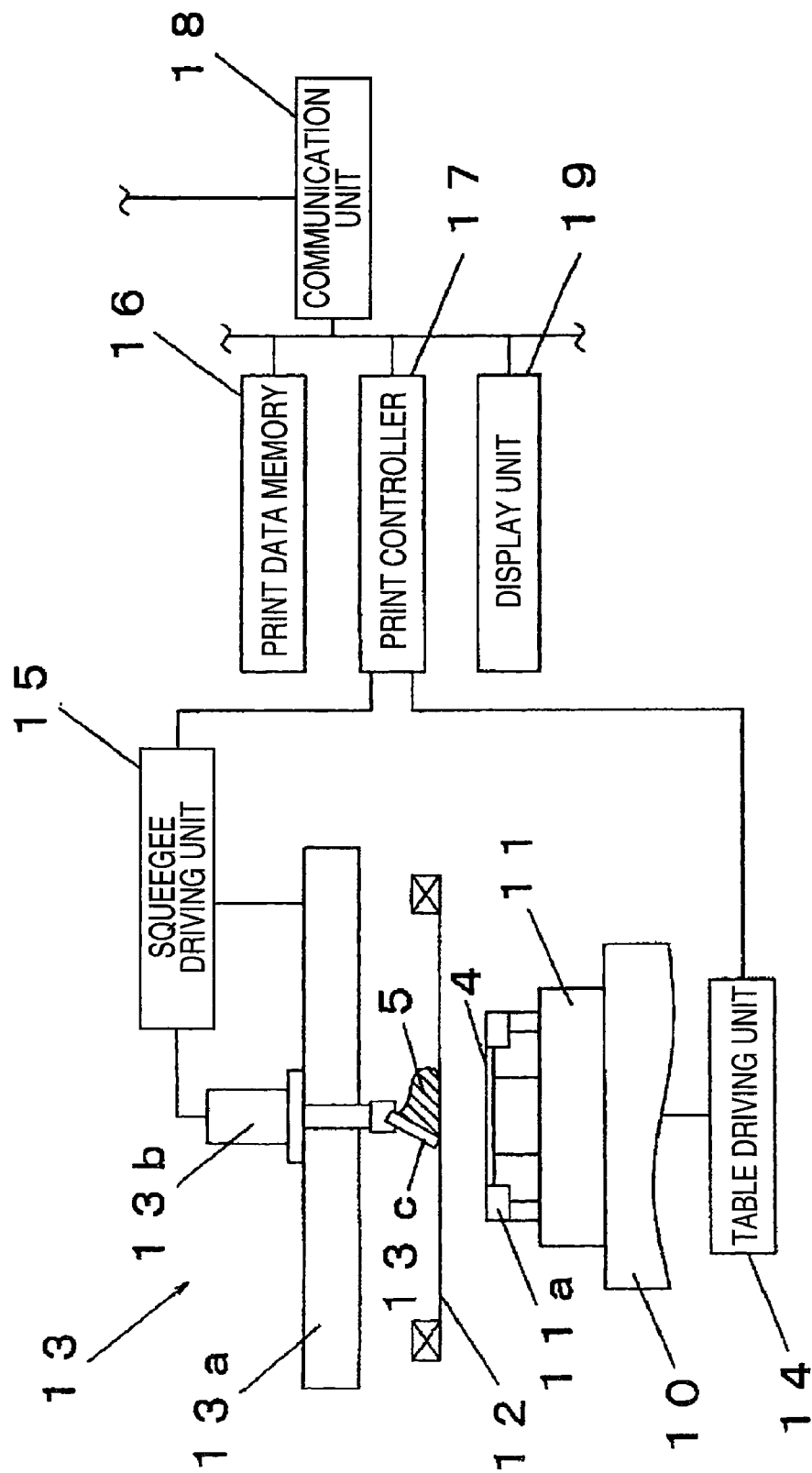
FIG. 2 is a block diagram illustrating a configuration of a screen printing apparatus according to an embodiment of the invention.

Next, a configuration of each apparatus will be described. First, referring to FIG. 2, a configuration of the printing apparatus M1 will be described. A circuit board holder 11 is disposed on a position determining table 10 in FIG. 2. The circuit board holder 11 maintains a circuit board 4 so as to hold both sides of the circuit board by a damper 11a.

Upon the circuit board holder 11, a mask plate 12 is disposed. Pattern holes (which are not illustrated in the drawings) corresponding to a print position of the circuit board 4 is provided on the mask plate 12. Since the position determining table 10 is driven by the table driving unit 14, the circuit board 4 moves in horizontal and vertical directions relative to the mask plate 12.

A squeegee section 13 is disposed on the mask plate 12. The squeegee section 13 ascends and descends a squeegee 13c about the mask plate 12. The squeegee section 13 includes an ascendant and descendant pressing mechanism 13b which presses against the mask plate 12 with predetermined pressing force and a squeegee moving mechanism 13a which makes the squeegee 13c move in a horizontal direction. The ascendant and descendant pressing mechanism 13b and squeegee moving mechanism 13a are driven by a squeegee driving unit 15. The squeegee 13c is horizontally moved at predetermined velocity along a surface of the mask plate 12 in which solder paste 5 is supplied in the state that the circuit board 4 directly contacts with a lower surface of the mask plate 12, and thus the solder paste 5 is printed on an electrode for a soldering 6 (refer to FIG. 9) formed on an upper surface of the circuit board 4 through the pattern holes which is not illustrated.

This print operation is performed by controlling the table driving unit 14 and the squeegee driving unit 15 by a print controller 17. In this control operation, an operation of the squeegee 13c or a position matching between the circuit board 4 and the mask plate 12 is controlled on the basis of print data stored in a print data memory 16. A display unit 19 displays index data indicating various operating state of the printing apparatus or a notice of a malfunction indicating an abnormal state of the print operation. A communication unit 18 is performed to transmit and receive data among the administration computer 3 or another apparatuses included in the electronic components mounting line 1 through the communication network 2.

Figure 3:
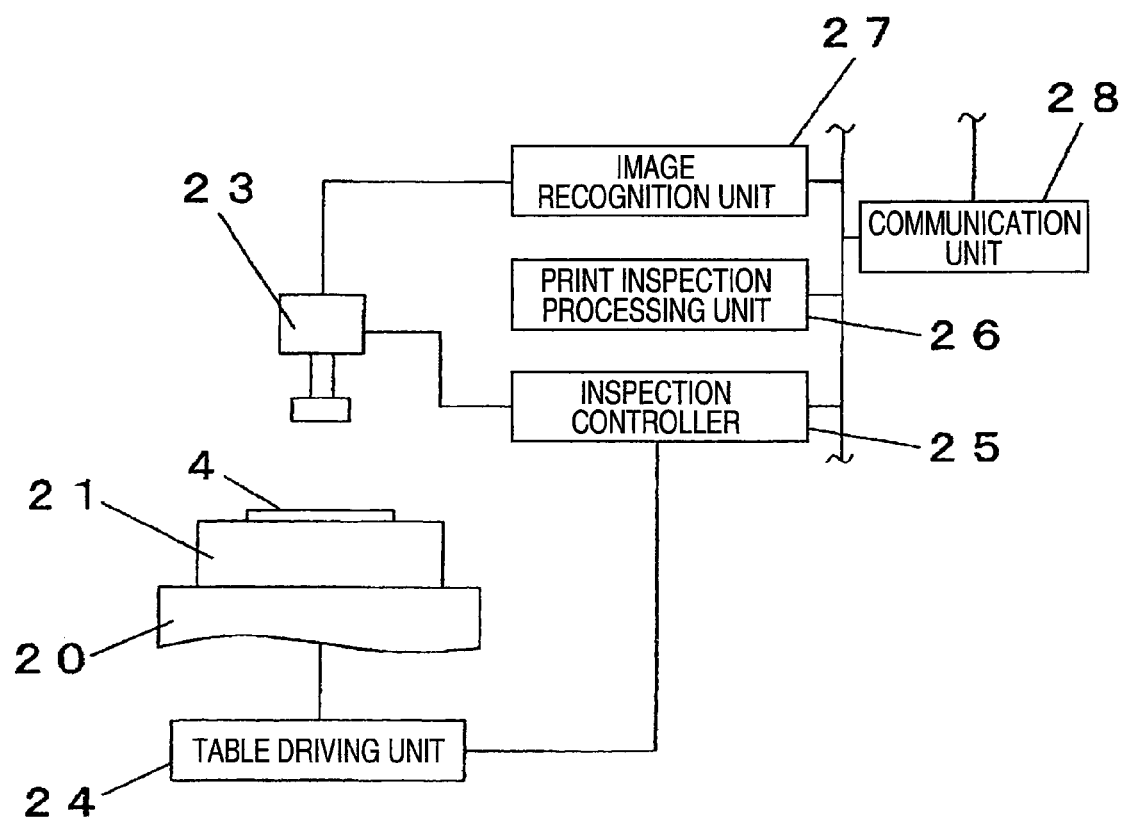
FIG. 3 is a block diagram illustrating a configuration of a print inspection apparatus according to an embodiment of the invention.

Referring to FIG. 3, the print inspection apparatus M2 will be described as below. In FIG. 3, a circuit board holder 21 is disposed on a position determining table 20, and the circuit board 4 is held by a circuit board holder 21. A camera 23 is disposed at upper side of the circuit board holder 21 so as to set imaging direction in a lower direction. The camera 23 takes an image of the circuit board 4 in state that the solder is printed by the printing apparatus M1. An inspection controller 25 controls a table driving unit 24 and the camera 23, thereby controlling an inspection operation. The position determining table 20 is driven to control the table driving unit 24 by the inspection controller 25, thereby being capable of imaging by making a position of the circuit board 4 locate just under the camera 23.

The image data taken by an imaging is subjected to a recognizing process by an image recognition unit 27. Due to this, a position of a solder printed on the circuit board 4 is detected by the printing apparatus M1. The detection result is outputted as soldering position data. An inspection processing unit 26 judges passing status of a solder printing on the basis of the soldering position data. Additionally, the data of soldering position is outputted as feedforward data and transmitted to the administration computer 3 or another apparatus (in this embodiment, the apparatus for the placing the electronic components M3 and the placement state inspecting apparatus M4) through a communication unit 28 and a communication network 2.

Figure 4:
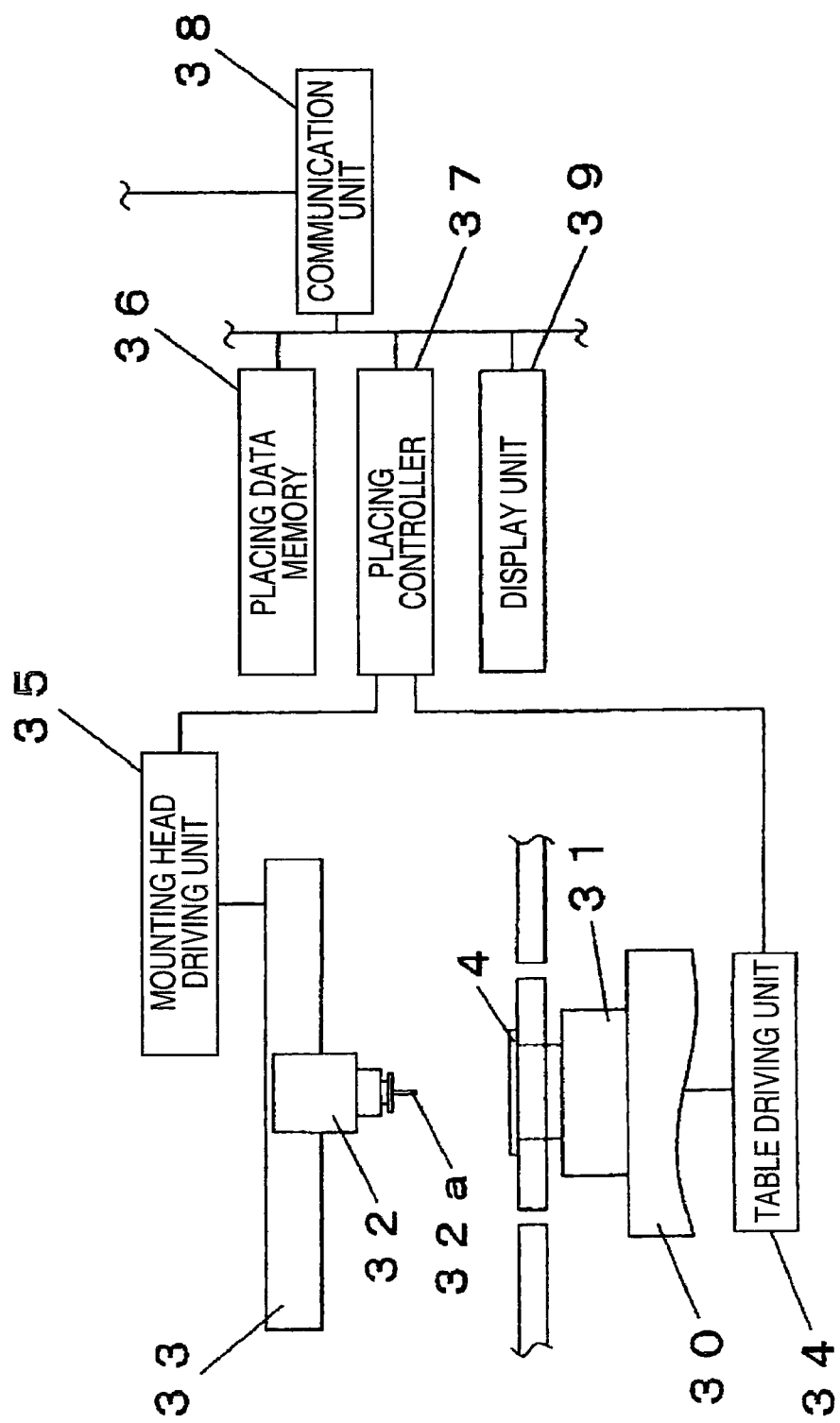
FIG. 4 is a block diagram illustrating a configuration of an electronic components placement apparatus according to an embodiment of the invention.

Next, a configuration of the electronic components placement apparatus M3 will be described by referring to FIG. 4. In FIG. 4, a circuit board holder 31 is disposed on a position determining table 30, and a circuit board holder 31 holds the circuit board 4 transferred from the print inspection apparatus M2. A mounting head 32 which is movable by a head driving mechanism 33 is disposed at an upper side of a circuit board holder 31. The mounting head 32 has a nozzle 32a adsorbing the electronic components, and the mounting head 32 picks out the electronic components from the components supply unit (not illustrated) by maintaining the adsorption of the nozzle 32a. Then, the mounting head 32 is moved to the upper side of the circuit board 4 and ascended toward the circuit board 4. Therefore, the electronic components held by the nozzle 32a are placed on the circuit board 4.

The head driving mechanism 33 and the position determining table 30 are driven by the mounting head driving unit 35 and the table driving unit 34, respectively. Placing position data indicating coordinates of a mounting position on the circuit board 4 which is subjected to a mounting process is stored as a control parameter in a placing data memory 36. In a components placement operation due to the mounting head 32, a placing controller 37 controls the table driving unit 34 and the mounting head driving unit 35 on the basis of this control parameter. Therefore, the electronic components are placed on the regular components placement position of the circuit board 4. In the embodiment, this control parameter is updated on the basis of the soldering position data obtained by the print inspection apparatus M2. A display unit 39 displays index data indicating various operating state of the electronic components placement apparatus M3 or a notice of a malfunction indicating an abnormal state of the print operation. A communication unit 38 is performed to transmit and receive data among the administration computer 3 or another apparatuses included in the electronic components mounting line 1 through the communication network 2.

Figure 5:
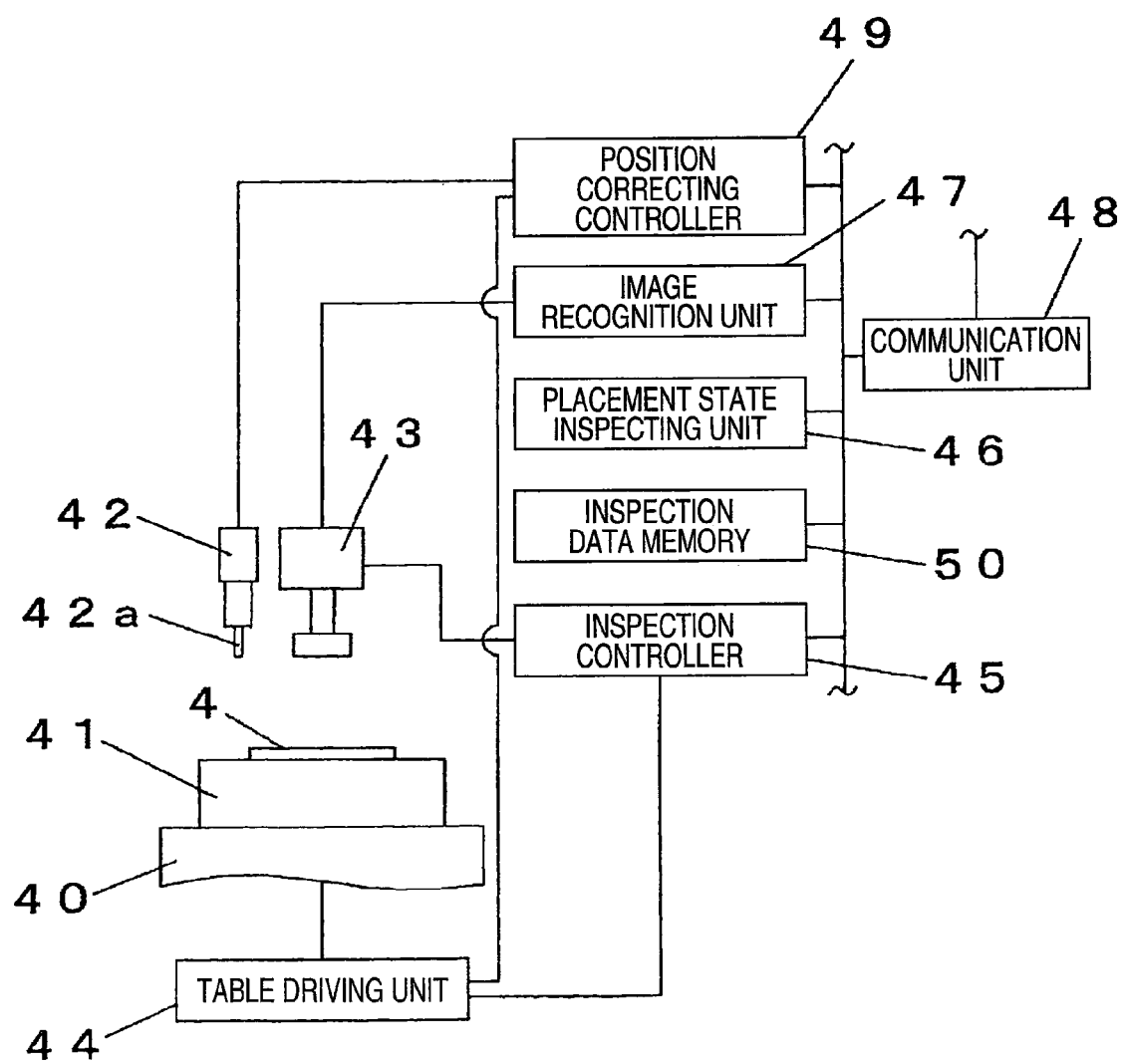
FIG. 5 is a block diagram illustrating a configuration of a placement state inspecting apparatus according to an embodiment of the invention.

Next, referring to FIG. 5, the placement state inspecting apparatus M4 which is connected to a downstream potion of the electronic components placement apparatus will be described. In FIG. 5, a position determining table 40, a circuit board holder 41, a camera 43, an inspection controller 45, an image recognition unit 47, an inspection processing unit 46, and communication unit 48 have the same function as the position determining table 20, the circuit board holder 21, the camera 23, the inspection controller 25, the image recognition unit 27, the inspection processing unit 26 and the communication unit 28 in the print inspection apparatus M2, respectively. Therefore, thanks to this function, the circuit board 4 where the electronic components are mounted by the electronic components placement apparatus M3 after the components placement is subjected to an inspection of a components placement state by the use of an inspection parameter which is stored in an inspection data memory 50.

Figure 6:
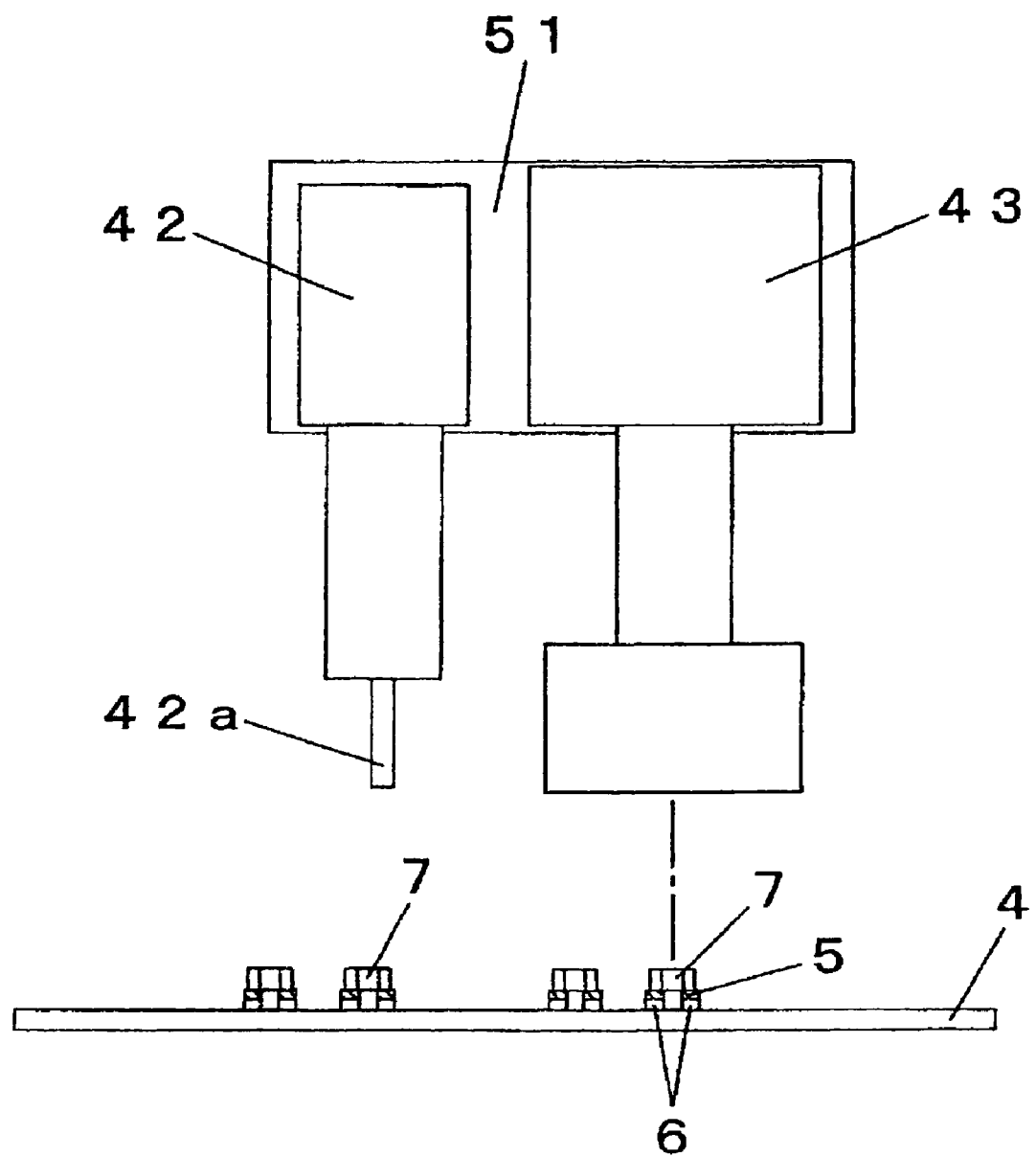
FIG. 6 is a diagram illustrating a function of a placement state inspecting apparatus according to an embodiment of the invention.
Figure 7:
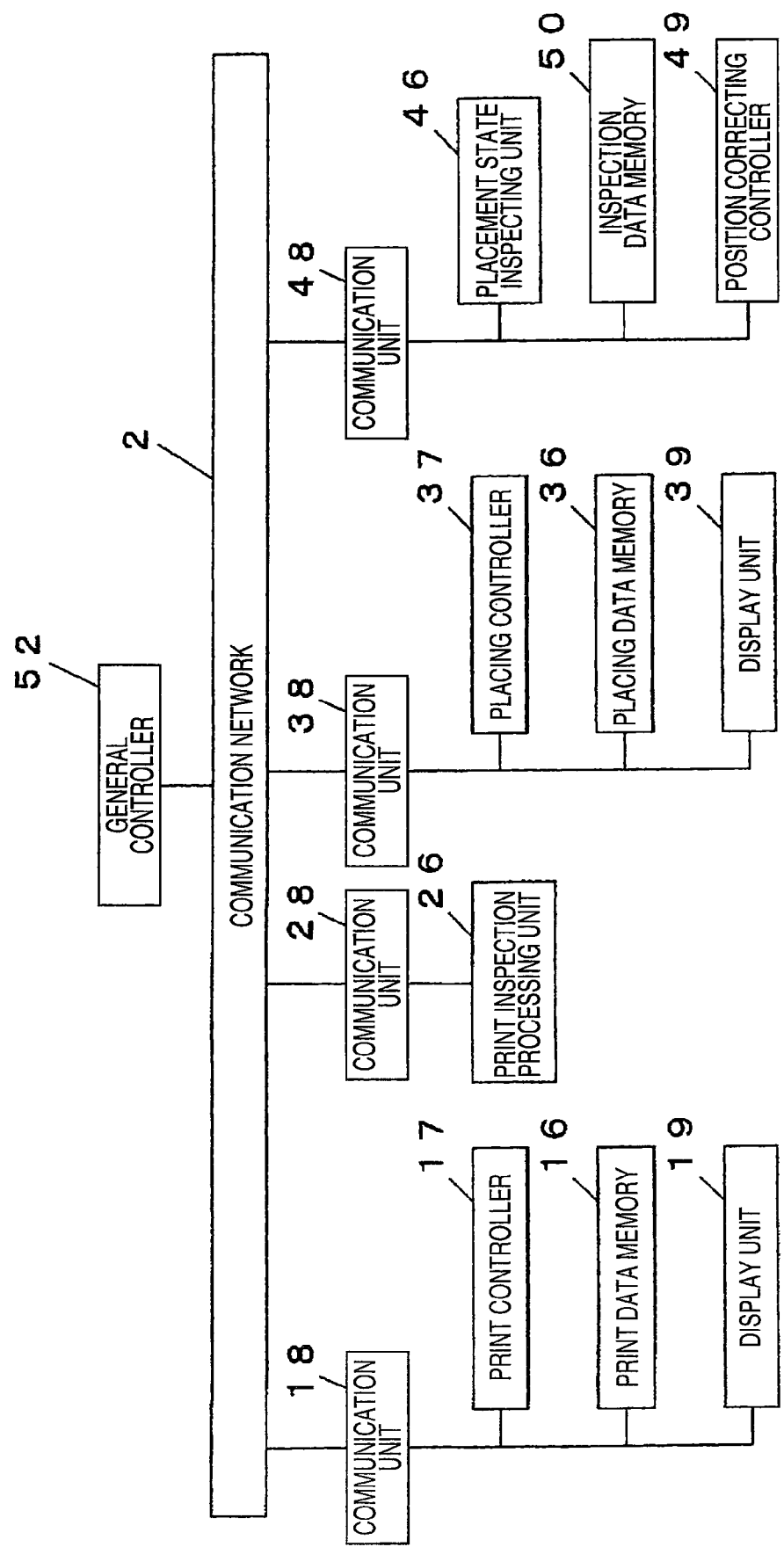
FIG. 7 is a block diagram illustrating a control system of an electronic components mounting system according to an embodiment of the invention.

As shown in FIG. 6, the circuit board 4 where the components are placed is imaged by the camera 43, and the imaging result is recognized by the image recognition unit 47. Therefore, a position of electronic components placed on the electrode 6 with the solder paste 5 interposed therebetween is detected. The detection result is outputted as data of components placement position. An inspection processing unit 46 judges whether the placement state is normal or not, by comparing the components placement position data with an inspection parameter stored in the inspection data memory 50, that is, a components standard position illustrating a regular position in the inspection.

In the embodiment, this inspection parameter is set to be updated on the basis of the soldering position data transmitted from the print inspection apparatus M2. Specifically, when the solder paste 5 departs from the electrode 6 in the printing apparatus M1, not a position of the electrode 6 but a position of the actual printed solder paste 5 is regarded as the regular components placement position, and the placement state inspection is performed. Additionally, in this inspection of components placement state, a placing position error is judged when the position departs from a standard position of the updated components out of a predetermined allowable range.

The placement state inspecting apparatus M4 is configured to have a correction function of components placement position added to this inspection function of components placement state. Specifically, as shown in FIG. 5, a position correcting head 42 having a nozzle 42a which is able to adsorb and hold the electronic components is disposed in the placement state inspecting apparatus M4. As shown in FIG. 6, the position correcting head 42 is fixed at a movable block 51 along with a camera 43. The movable block 51 is horizontally moved by a head moving mechanism (not illustrated), and thus the position correcting head 42 and the camera 43 are moved as one body.

An operation of the position correcting head 42 is controlled by the position correcting controller 49, whereby the electronic components 7 which are previously placed on the circuit board 4 is held by the nozzle 42a. Accordingly, the position of the components can be corrected. The position correcting controller 49 corrects the position of the electronic components 7 which are judged to be the placing position error in the placement state inspection described above by transferring the components to a correct standard position by the position correcting head 42. Consequently, the position correcting head 42 and the position correcting controller 49 constitutes the components placement position correction unit which transfer the electronic components 7 departing from the standard position of the components out of an allowable range to the standard position of the components. In an example illustrated in the embodiment, this components placement position correction unit is provided to the placement state inspecting apparatus M4 which is the second inspection apparatus. Among such a method of holding the electronic components by the use of the position correcting head, it is possible to use a mechanical clamping method instead of the method that the electronic components are adsorbed and held by the nozzle 42a in the embodiment.

Additionally, it may be allowed to properly determine which apparatus corrects the components placement position with respect to an actual line configuration. For example, it is possible to provide the components placement position correction unit to the independent electronic components transferring apparatus which is connected to a downstream side of the placement state inspecting apparatus M4. In this case, when the components placement position is corrected, it is possible to correct the position error state by discharging electronic components which is in the position error state and placing a new electronic components instead of the old electronic components.

Next, referring to FIG. 6, it will be described about a configuration of the control system in the electronic components mounting system. Herein, a data transmitting and receiving function on purpose to manage quality in the process of the electronic components mounting will be described. In FIG. 6, the general controller 52 is in charge of the quality control function in the range of the control process which is performed by the administration computer 3. The controller also receives data transmitted from each apparatus which forms the electronic components mounting line through the communication network 2, and performs a required judgment process based on a predetermined judgment algorithm. A result of the judgment process is outputted as command data to each apparatus through the communication network 2.

Consequently, the print inspection processing unit 16 and the placement state inspecting unit 46 which is provided to the print inspection apparatus M2 and the placement state inspecting apparatus M4 are connected to the communication network through the communication units 18 and 48, respectively. In addition, the units (refer to FIGS. 3, 4, and 5) provided in the printing apparatus M1 and the electronic components placement apparatus M3 are connected to the communication network 2 through the communication units 28 and 38, respectively.

Due to this, a feedback process which corrects and updates a control parameter of an upstream side apparatus on the basis of data extracted from any one of inspection processes or a feedforward process which corrects and updates a control parameter and an inspection parameter of downstream side apparatus is configured to be capable of occasionally performing the processes during operating each apparatus. In the embodiment as mentioned above, the control parameter and the inspection parameter used in the electronic components placement apparatus M3 and the placement state inspecting apparatus M4 are updated on the basis of the soldering position data detected by the print inspection apparatus M2. When the administration computer 3 which functions as the general controller 52 is not included therein, the data transmitting and receiving function described above is added to the control function of each apparatus constituting the electronic components mounting system, and thus the same process described above can be performed.

In the configuration of the electronic components mounting system, the print inspection apparatus M2 is independently provided between the printing apparatus M1 and the electronic components placement apparatus M3. However, it is possible to subordinate a function of the print inspection apparatus M2 to the printing apparatus M1 or the electronic components placement apparatus M3. Specifically, the camera 23 is disposed so as to be capable of imaging the printed circuit board 4 in the printing apparatus M1, and functions of the inspection controller 25, the inspection processing unit 26, and the image recognition unit 27 are added to a control function of the print inspection apparatus M2. On this account, the same inspection and measurement in the printing apparatus M1 is performed on the printed circuit board 4. It is also the same in the case of subordinating these functions to the electronic components placement apparatus M3. In this case, the same inspection is performed on the circuit board 4 which is directly transferred from the printing apparatus M1 before the components placement operation, in the electronic components placement apparatus M3.

Figure 8:
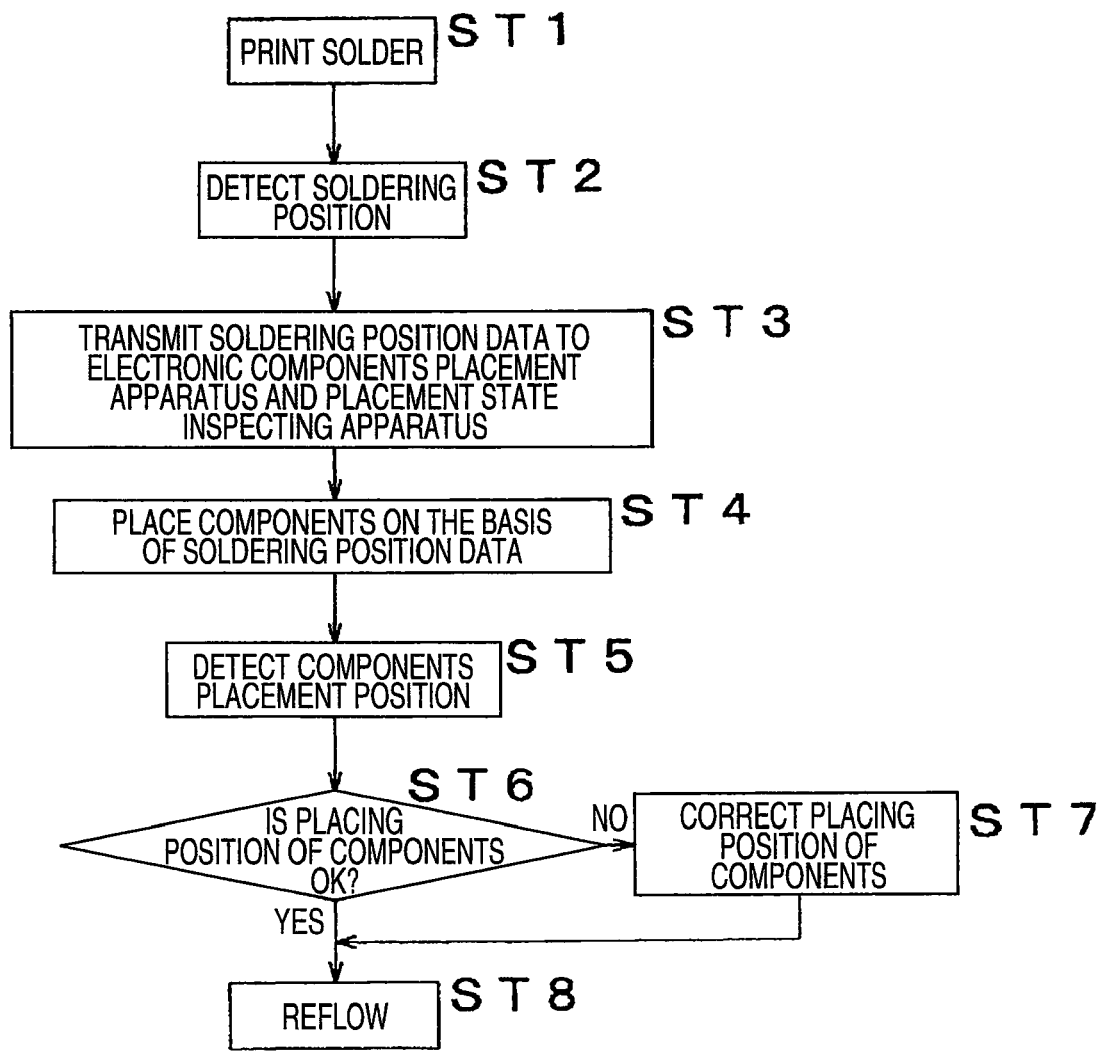
FIG. 8 is a flow chart illustrating an electronic components mounting method according to an embodiment of the invention.
Figure 9:
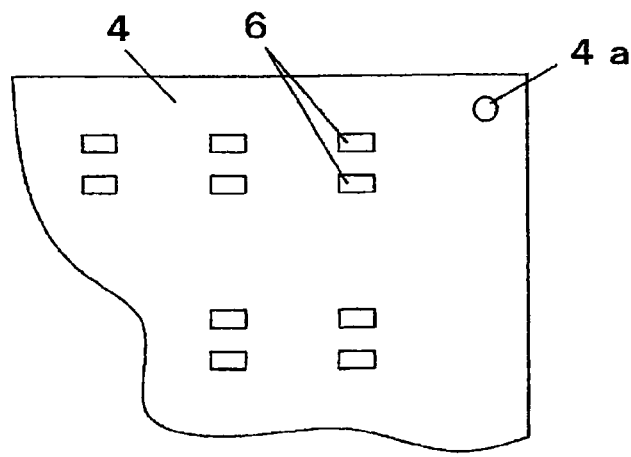
FIGS. 9(a) to 9(c) are diagrams illustrating a standard position of components in an electronic components mounting method according to an embodiment of the invention.
Figure 9:
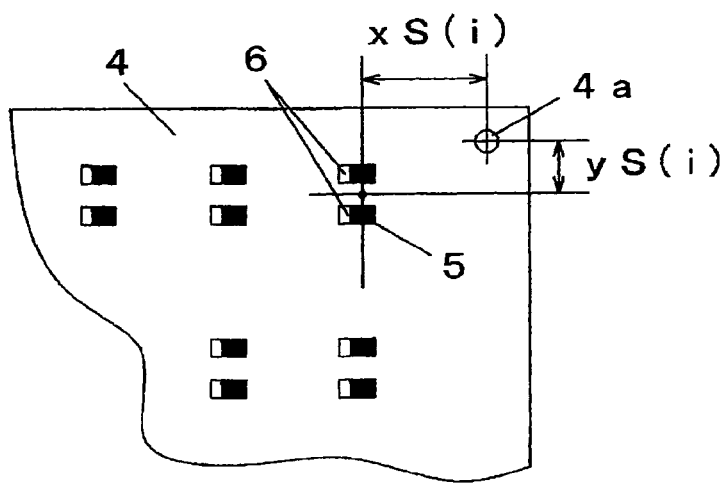
Figure 9:
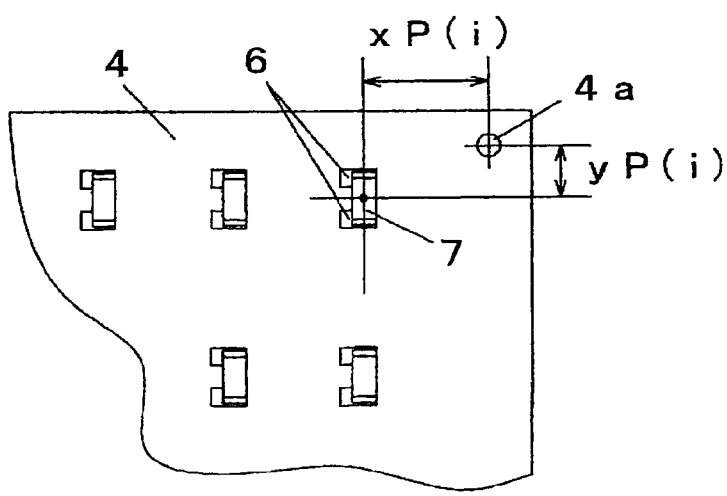
Figure 10:
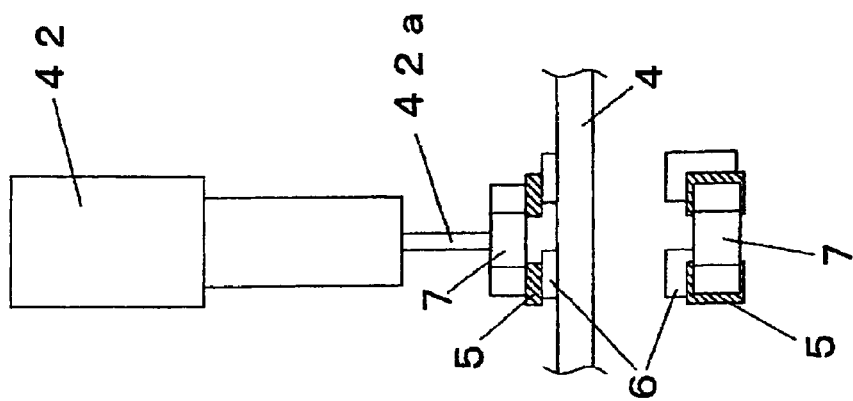
FIGS. 10(a) and 10(b) are diagram illustrating an operation of a placement state inspecting apparatus according to an embodiment of the invention.
Figure 10:
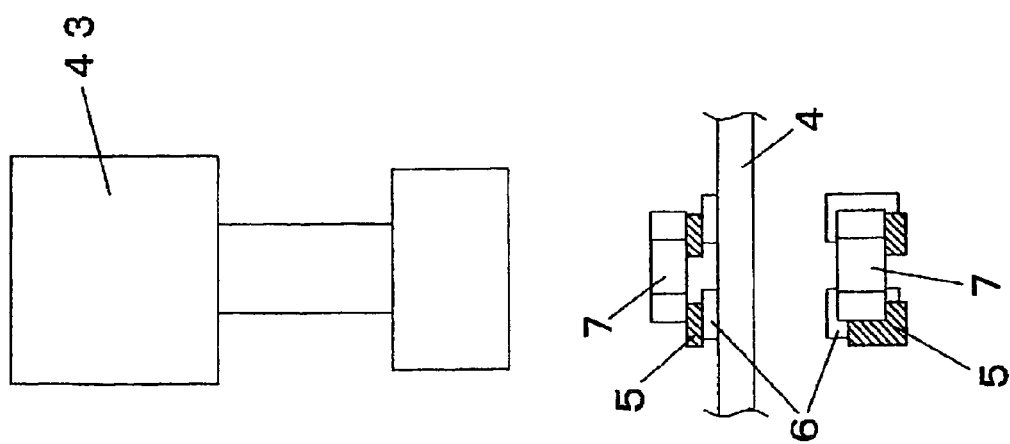

The electronic components mounting system is configured as mentioned above, and an electronic components mounting method will be described as below. It will be described by referring to FIGS. 9 and 10 along a flow of FIG. 8. The circuit board 4 which is supplied from the circuit board supply unit (not illustrated) of upstream side is previously transferred to the printing apparatus M1 and held by the circuit board holder 11. In the circuit board 4, as shown in FIG. 9(a), the electrode 6 for soldering a plurality of electronic components is formed to be a pair at a mounting point of the electronic components, along with a recognition mark 4a for detecting a position. The solder paste 5 is printed on each electrode 6 as shown in FIG. 9(b) (a printing process, ST1).

Subsequently, the circuit board 4 is transferred to the print inspection apparatus M2, and a soldering position detection is performed (ST2). As shown in FIG. 10(a), the circuit board 4 is imaged by the camera 43 and performed to recognize the image. Therefore, as shown in FIG. 9(b), a position data (the soldering position data) which indicates a weight center position of the solder paste 5 printed on a pair of the electrode 6 is outputted to every mounting point as xS(i) and yS(i) which are coordinates based on the recognition mark 4a (a soldering position detecting process).

The recognition result is processed by the print inspection processing unit 16, and thus a passing status of the print result is judged. Along with this, the soldering position data is transmitted as the feedforward data to the electronic components placement apparatus M3 and the placement state inspecting apparatus M4 through the communication unit 18 and the communication network 2 (ST3). The transmitted soldering position data is stored in the placing data memory 36 and the inspection data memory 50. Thanks to this, the control parameter which indicates the placing position in the components placement operation due to the electronic components placement apparatus M3 and the inspection parameter which indicates the standard position of the components in the inspection due to the placement state inspecting apparatus M4 are updated on the basis of the soldering position data.

Next, the circuit board 4 where the solder is printed is transferred to the electronic components placement apparatus M3. Herein, the components placement process is performed on the basis of the data of soldering position (ST4). Specifically, the electronic components 7 are picked up from the components supply unit by the mounting head 32.

The electronic components 7 are transferred to the circuit board 4 where the solder paste 5 is printed, thereby placing the components on the electrode 6 with the solder paste 5 interposed therebetween (a placing process). On this occasion, the control parameter ordered to the table driving unit 34 and the mounting head driving unit 35, that is, the placing position in the circuit board 4 is updated on the basis of the data of soldering position where a feedforward is performed, and the electronic components 7 are placed on the target position where the solder paste 5 is printed.

Next, the circuit board 4 where the electronic components are placed is transferred to the placement state inspecting apparatus M4. Herein, the components placement position detection for inspecting the placement state of the electronic components (ST5). As shown in FIG. 9(c), the components placement position which indicates the weight center position of the electronic components 7 placed on every mounting point is outputted as the coordinates of xP(i) and yP(i) based on the recognition mark 4a. Then, the result of the position detection is outputted as the data of components placement position (a process of the components placement position detection). Additionally, since the data of components placement position is compared with the inspection parameter (i.e. the data of soldering position where a feedforward is performed from the print inspection apparatus M2) which is stored in the inspection data memory 50, it is judged whether the components placement position is OK or not, that is, whether the electronic components 7 are placed on the solder paste 5 printed on the electrode 6 without any position error (ST6).

Herein, when the components placement position is not OK and the electronic components 7 depart from the solder paste 5 as shown FIG. 10(a), the correction of the components placement position is performed (a process for correcting the components placement position, ST7). Specifically, the position correcting head 42 is moved to an upper side of the electronic components 7 which departs from the target position. Then, the electronic components 7 are adsorbed and held by the nozzle 42a, and the position of the electronic components 7 is corrected on the basis of the soldering position data. Due to this, the electronic components 7 are placed on the solder paste 5 which is printed on the electrode 6 without the position error as shown in FIG. 10(b). After this step, the circuit board 4 where the electronic components 7 are placed is transferred to the reflow apparatus M5, whereby the circuit board 4 is heated. Therefore, a solder component in the solder paste 5 is melted, and thus the electronic components 7 are soldered to the electrode 6 (a soldering process)

In the electronic components mounting method as mentioned above, the process for correcting the components placement position which corrects a position by transferring the electronic components 7 which depart from the standard position of components out of an allowable range to the standard position of components is performed before the soldering process in the circuit board 4 where the solder paste 5 is printed. Due to this, a reflow of the solder is performed in the state that the electronic components 7 are correctly matched to the solder paste 5. When the electronic components 7 relatively departs from the electrode 6 by the position error in the components placement operation, it is possible to correctly match the position of the electronic components 7 by being pulled to the electrode 6 in accordance with self alignment effect of a melting solder. Therefore, the correct soldering is achieved without the position error.

As mentioned above, in the electronic components mounting system represented by the embodiment, the position of the solder paste 5 which is printed on the electrode 6 of the circuit board 4 is transmitted as the soldering position data detected by the print inspection apparatus M2 to the downstream apparatus so as to be feedforward data. Based on the feedforward data, the control parameter in the components placement operation due to the electronic components placement apparatus M3 is updated. Then the inspection parameter in the components placement state inspection due to the placement state inspecting apparatus M4 is updated. As a result, by effectively and properly using inspection information obtained from each process, it is possible to achieve a precise mounting management.

Industrial Applicability

An electronic components mounting system, a placement state inspecting apparatus, and an electronic components mounting method have an advantage which is possible to precisely manage a mounting accuracy by effectively and properly using inspection information obtained from each process. The electronic components mounting system, the placement state inspecting apparatus, and the electronic components mounting method are formed of a plurality of electronic components mounting apparatus connected to each other and, it is useful in fields fabricating a mount circuit board by soldering electronic components on a circuit board The present disclosure relates to subject matter contained in priority Japanese Patent Application No. 2006-110675 filed on Apr. 13, 2006, the content of which is herein expressly incorporated by reference in its entirety.

The invention claimed is:

1. An electronic components mounting method of fabricating a mount circuit board by soldering electronic components on a circuit board, the method comprising:
   a printing process of printing solder paste on electrodes which are formed on the circuit board and to which the electronic components are bonded, by the use of a printing apparatus;
   a detection process of detecting a position of the printed solder paste and outputting the detection result as soldering position data, by the use of a first inspection apparatus;
   a placing process of picking up the electronic components from components supply unit by the use of a mounting head and placing the electronic components on the circuit board on which the solder paste is printed;
   a components placement position detection process of detecting a position of each of the electronic components placed on the circuit board on which the solder paste is printed and outputting the detection result as the components placement position data, by the use of a second inspection apparatus;
   a components placement position correcting step of correcting a position of any of the electronic components departing from a standard position beyond an allowable range by transferring the departed position to the standard position in the circuit board on which the solder paste is printed; and
   a soldering process of soldering the placed electronic components on the circuit board by heating and melting the solder paste, by using soldering means,
   wherein an inspection parameter indicating the standard position of each of the electronic components is updated on the basis of the soldering position data by regarding the detected position of the printed solder paste as the standard position.

2. The electronic components mounting method according to claim 1, wherein a control parameter indicating the placing position at the time of placing the electronic components by the use of the electronic components placement apparatus and the inspection parameter are updated on the basis of the soldering position data.

* * * * *